United States Patent
O'Keeffe et al.

(10) Patent No.: US 8,959,408 B1
(45) Date of Patent: Feb. 17, 2015

(54) FORWARD ERROR CORRECTION FOR COMMUNICATIONS SYSTEMS

(75) Inventors: Francis Joseph O'Keeffe, Glounthaune (IE); Thomas J. Cloonan, Lisle, IL (US); Ayham Al-Banna, Orland Park, IL (US); Michael J. Emmendorfer, Saint Peters, MO (US)

(73) Assignee: ARRIS Enterprises, Inc., Suwanee, GA (US)

( * ) Notice: Subject to any disclaimer, the term of this patent is extended or adjusted under 35 U.S.C. 154(b) by 142 days.

(21) Appl. No.: 13/528,439

(22) Filed: Jun. 20, 2012

(51) Int. Cl.
 *G06F 11/00* (2006.01)
 *G06F 11/30* (2006.01)
 *G08C 25/00* (2006.01)
 *H03M 13/00* (2006.01)
 *H04L 1/00* (2006.01)

(52) U.S. Cl.
 USPC ......................................................... 714/746

(58) Field of Classification Search
 CPC ... H04L 1/1819; H04L 1/1812; H04L 1/1845; H04L 1/0057; H04L 1/0071; H04L 1/0041; H03M 13/116; H03M 13/1111; H03M 13/1137; H03M 13/2924; H03M 13/255; H03M 13/2903; H03M 13/2933; H03M 13/2906; H03M 13/356; H03M 13/2936
 See application file for complete search history.

(56) References Cited

U.S. PATENT DOCUMENTS

| | | | | |
|---|---|---|---|---|
| 5,305,352 | A * | 4/1994 | Calderbank et al. | 375/261 |
| 7,426,241 | B2 * | 9/2008 | Proctor, Jr. | 375/265 |
| 7,451,381 | B2 * | 11/2008 | Miller et al. | 714/774 |
| 7,971,129 | B2 * | 6/2011 | Watson et al. | 714/784 |
| 8,237,869 | B2 * | 8/2012 | Blouin et al. | 348/726 |
| 2003/0039317 | A1 * | 2/2003 | Taylor et al. | 375/295 |
| 2005/0018635 | A1 * | 1/2005 | Proctor, Jr. | 370/335 |
| 2010/0074350 | A1 * | 3/2010 | Malladi et al. | 375/260 |
| 2012/0263211 | A1 * | 10/2012 | Porat et al. | 375/219 |
| 2013/0086454 | A1 * | 4/2013 | Rub | 714/773 |
| 2013/0089085 | A1 * | 4/2013 | Ben-Moshe et al. | 370/338 |
| 2013/0145231 | A1 * | 6/2013 | Frayer et al. | 714/763 |
| 2013/0287023 | A1 * | 10/2013 | Bims | 370/389 |

* cited by examiner

*Primary Examiner* — Guerrier Merant
(74) *Attorney, Agent, or Firm* — Troy A. Van Aacken

(57) ABSTRACT

Systems and methods can operate to improve the communication bandwidth in communication systems. Communication systems can use new forward error correction (FEC) algorithms to increase communication bandwidth. New FEC algorithms can also enable the use of other modulation formats to further improve communication bandwidth. Communication devices that can select from a plurality of FEC algorithms and modulation formats can maintain backward compatibility with the deployed FEC algorithms and modulation formats implemented in legacy communication devices while realizing increased communication bandwidth.

19 Claims, 6 Drawing Sheets

FORWARD ERROR CORRECTION FOR COMMUNICATIONS SYSTEMS

TECHNICAL FIELD

This disclosure relates to the use of forward error correction (FEC) algorithms in communication systems.

BACKGROUND

Communication systems can transmit information over wired and/or wireless transmission media. Such transmission media is typically subject to noise, interference and distortion, each of which can introduce errors in the transmission of information. Communication systems can use protocols including error detecting algorithms (e.g., cyclic redundancy check) to determine if the received information is in error. Communications systems can also include protocols with retry mechanisms wherein the information received with errors can be re-transmitted.

A BER (bit error rate) represents one measurement of the transmission characteristics of communication systems. The BER can be represented by the ratio of the number of bit errors over the number of bits transmitted over a time period. Reduction of the BER can increase the bandwidth for the transmission of communication information through minimizing communication information retries and enabling higher bandwidth modulation formats. In some existing systems, a FEC (forward error correction) algorithm is used in an attempt to reduce the BER. A FEC algorithm can use error correcting codes that can be transmitted with communication information and can enable one or more receivers to reconstruct the communication information with errors introduced during transmission.

BRIEF DESCRIPTION OF THE DRAWINGS

Many details of the disclosure can be better understood with reference to the following drawings. The elements in the drawings are not necessarily to scale, emphasis instead being placed upon clearly illustrating the principles of the present disclosure.

Like reference numbers and designations in the various drawings indicate like elements.

DETAILED DESCRIPTION

In some implementations of this disclosure, methods, systems, and apparatus can improve the communication bandwidth of a communication system where FEC algorithms are used. Improved FEC algorithms can also enable the use of other modulation formats to further increase the communication systems bandwidth. The same FEC algorithm can be used in the communication system for the transmission and reception of information. In some implementations, communication devices can select from a plurality of FEC algorithms and modulation formats thereby facilitating maintains backward compatibility with deployed FEC algorithms and modulation formats implemented in legacy communication devices while realizing increased communication bandwidth.

Figure 1:
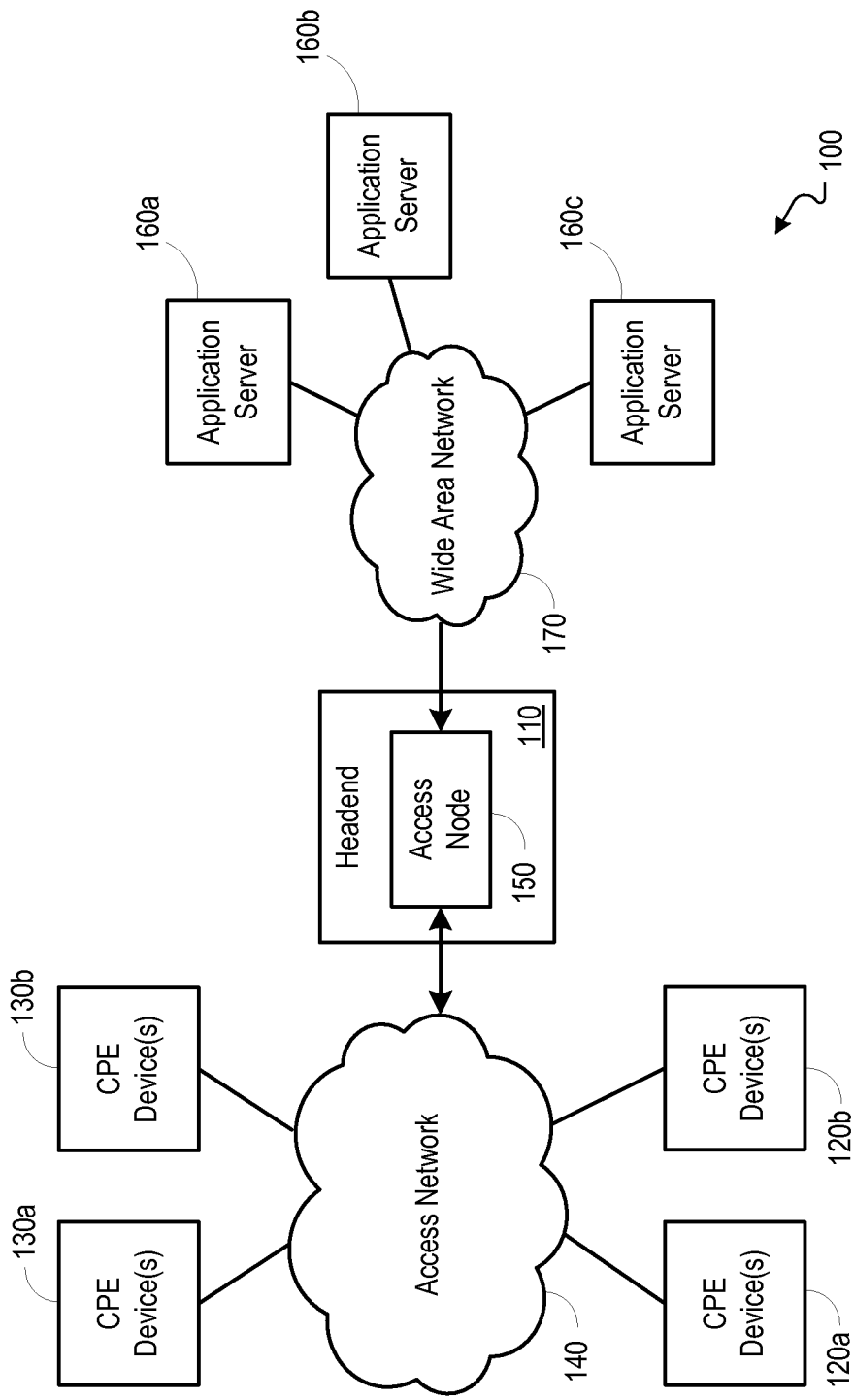
FIG. 1 is a block diagram illustrating an example communications system operable to provide upstream and downstream communication using a plurality of FEC algorithms.

FIG. 1 is a block diagram illustrating an exemplary communications system operable to provide upstream and downstream communication using a plurality of FEC algorithms. In some implementations, a headend 110 can provide video, data and/or voice services to CPE devices 120a-b and 130a-b in one or more subscriber groups (e.g., service groups) through an access network 140. In some implementations, CPE devices 120a-b and 130a can be cable modems, enhanced media terminal adapters (eMTA), set-top boxes, media gateways and modems. CPE devices 120a-b can implement deployed FEC algorithms. In some implementations, CPE devices 130a-b can implement deployed FEC algorithms and new FEC algorithms facilitating increased communication bandwidth. In various implementations, the access network 140 can be based on any of the CATV data over cable service interface specification (DOCSIS), 802.16, fiber to the curb (FTTC), fiber to the premise (FTTP) or satellite access networks.

The headend 110 can include devices such as an access node 150. In some implementations, access node 150 can be a cable modem termination system (CMTS) and/or an edge quadrature amplitude modulation (EQAM) device, or a combined device including multiple edge and/or video or data processing functionalities. Such devices can operate to facilitate communications between application servers 160a-c on a wide area network 170 and the CPE devices 120a-b and 130a-b. In various implementations, the network 170 can include one or more networks internal to the headend and/or one or more network external to the headend (e.g., one or more extranets, the Internet, etc.).

Communication services can be handled by the headend 110 through access node 150. The access node 150 can send/receive communication information to/from application servers 160a-c or nodes through wide area networks 170. The wide area networks 170, for example, can operate using Internet protocol (IP), sending communication information to and communication information from the headend 110. In some examples, the access node 150 can be paired with a SIP proxy server (not shown) operable to provide voice over internet protocol (VoIP) services with voice connectivity to other subscribers or voice connectivity to a public switched telephone network (PSTN) (not shown). In still further examples, one or more video sources (not shown) may provide streaming communication information through the wide area networks 170 to the access node 150.

In some implementations, the access node 150 can forward communication information destined for subscribers to an EQAM device used to modulate the signal onto a carrier waveform. The carrier waveform can include both data and video streams, in both multicast and unicast (e.g., point-to-point) formats for transmission to a combiner, which can combine multiple signals onto a single fiber for transmission to one or more CPE devices 120a-b and 130a-b via the access network 140. In other implementations, the access node 150 can modulate a baseband signal to a carrier wave and transmit the signal to a combiner for upconversion to a transmission frequency.

Figure 2:
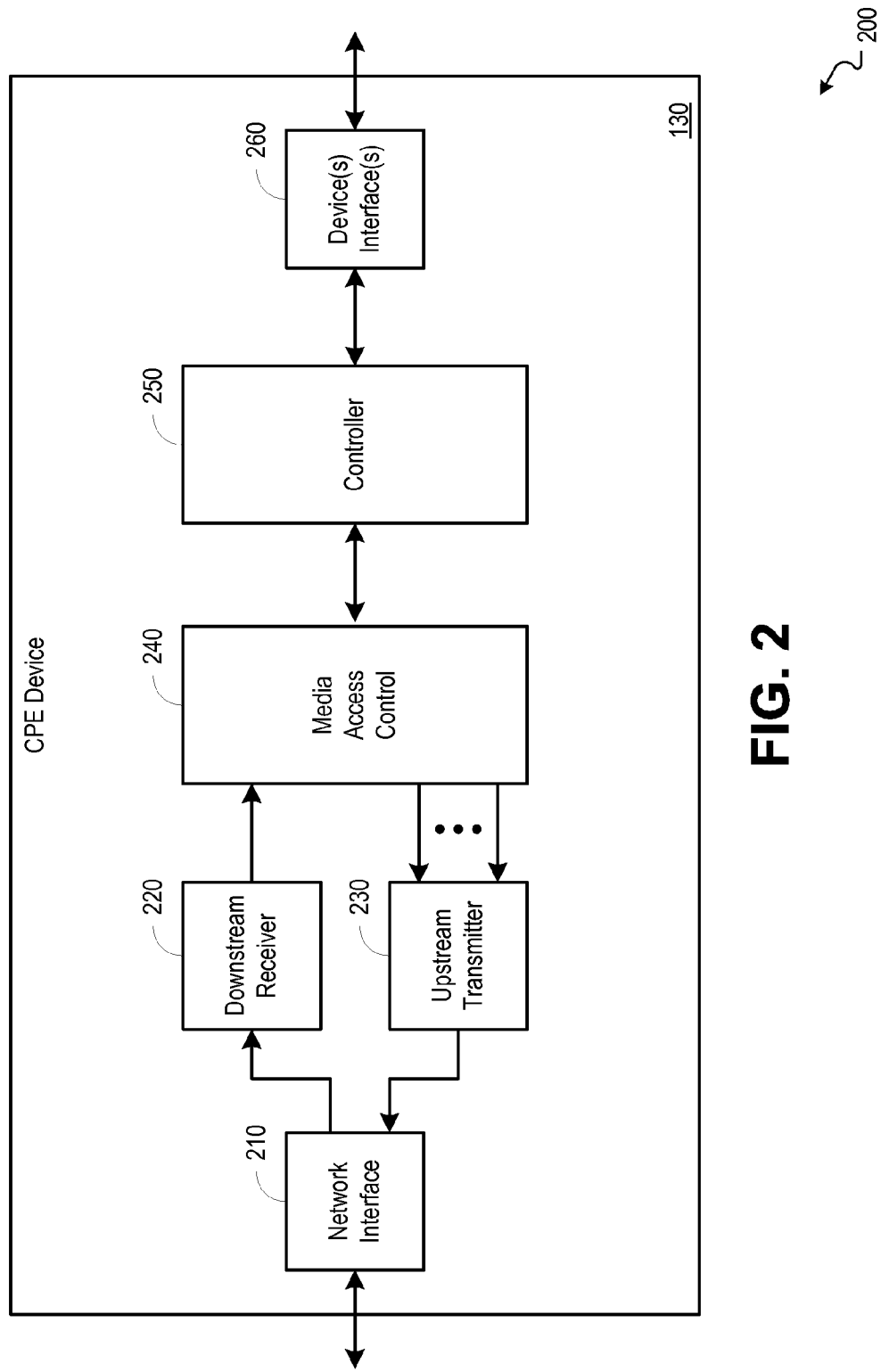
FIG. 2 is a block diagram illustrating an example customer premise equipment (CPE) device operable to provide upstream and downstream communication using FEC algorithms.

FIG. 2 is a block diagram illustrating an example customer premise equipment (CPE) device operable to provide upstream and downstream communication using a plurality of deployed and new FEC algorithms. A CPE device (e.g., CPE devices 130a-b of FIG. 1) can include an access network interface 210. The access network interface 210 can facilitate reception and transmission of communication information via an access network (e.g., access network 140 of FIG. 1). Downstream signals can be received from a headend access node (e.g., access node 150 of FIG. 1) via the access network, and upstream signals can be sent to the headend access node via the access network.

In some implementations, the CPE device 130 can include one or more downstream receivers 220. The downstream receivers 220 can include a tuner, demodulator, analog to digital convertor and analog signal conditioning circuitry. The downstream receivers 220 can support a plurality of selectable deployed and new FEC algorithms for processing received communication information. In some implementations, a deployed FEC algorithm can be Reed-Solomon-type algorithm, and a new FEC algorithm can include a low-density parity-check (LDPC). In other implementations, other FEC algorithms can be used.

In some implementations, the downstream receiver 220 can support a plurality of selectable single-carrier demodulation formats (e.g., 1024-quadrature amplitude modulation (1024-QAM), 4096-QAM, etc.). In other implementations, multi-carrier demodulation formats such as, for example, orthogonal frequency division multiplexing/orthogonal frequency division multiple access (OFDM/OFDMA), wavelet or sigma-delta modulation (SDM), among others, can be used.

In some implementations, the downstream receivers 220 can provide the media access controller (MAC) 240 with communication information from a downstream communication path (e.g., channel). In other implementations, the downstream receiver 220 can be capable of providing communication information to the MAC 240 from multiple downstream communication paths (e.g., channel bonding) wherein one or a plurality of FEC algorithms can be used on the different downstream communication paths (e.g., channels). In some implementations, elements of the downstream receivers 220 can be integrated into MAC 240.

The controller 250 can provide packet processing and control of the network access interface 210, downstream receivers 220, MAC module 240, upstream transmitters 230 and the device interfaces 260. In other implementations, the associated processing and control of the CPE device 130 can be distributed between the MAC module 240 and the controller 250.

The controller 250 can also facilitate communication between the CPE devices 130 and external devices such as a personal computer (PC) through device interfaces 260. Device interfaces 260 can include industry standard ethernet, wireless (e.g., 802.11) and universal serial bus (USB) interfaces, among many others. In other implementations, device interfaces 260 can be integrated in controller 250.

The CPE device 130 can also include one or more upstream transmitters 230. The MAC 240 can provide the upstream transmitters 230 with communication information to be transmitted on an upstream communication path (e.g., channel). In some implementations, the deployed or new FEC algorithms can be used on the upstream communication path (e.g., channel). In other implementations, the MAC 240 can be capable of providing communication information to the upstream transmitters 230 for transmission on multiple upstream communication paths (e.g., channel bonding) wherein the same or different FEC algorithms can be used on the different upstream communication paths (e.g., channels). In some implementations, elements of the upstream transmitters 230 can be integrated into MAC 240.

The upstream transmitters 230 can include a modulator, digital to analog convertor and analog signal conditioning circuitry. In some implementations, the upstream transmitters 230 can support a plurality of selectable deployed and new FEC algorithms for transmitting received communication information from MAC 240. For example, a deployed FEC algorithm can be a Reed-Solomon-type FEC algorithm, while a new FEC algorithm can include a low-density parity-check (LDPC) type algorithm. In other implementations, other FEC algorithms can be used.

In some implementations, the upstream transmitter 230 can support a plurality of selectable single-carrier modulation formats (e.g., quadrature phase shift keying (QPSK), 256-QAM, 1024-QAM, etc.). In other implementations, multi-carrier modulation formats such as, for example, orthogonal frequency division multiplexing/orthogonal frequency division multiple access (OFDM/OFDMA) or wavelet, sub-band division multiplexing (SDM). among others, can be used.

Figure 3:
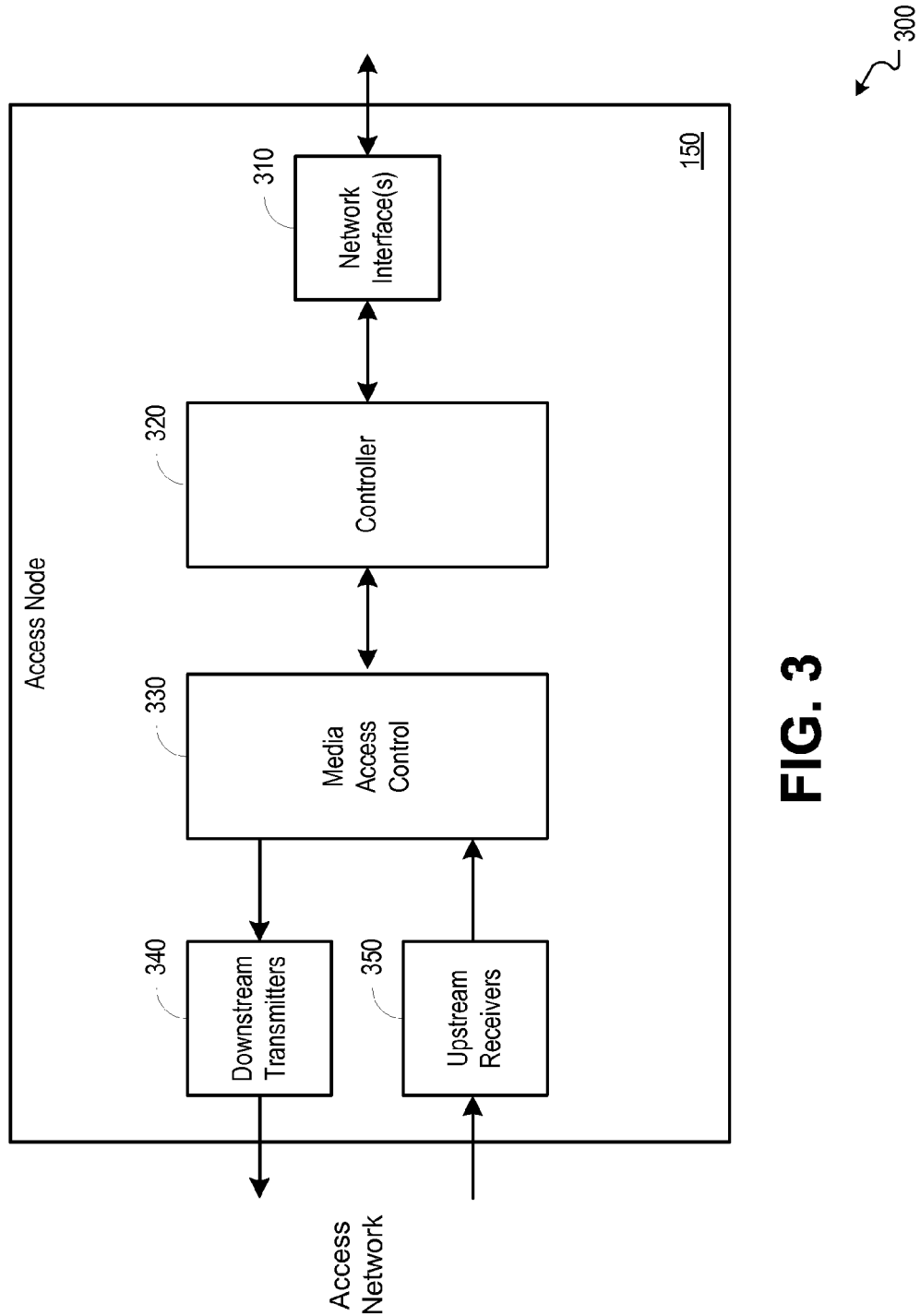
FIG. 3 is a block diagram illustrating an example access node operable to provide upstream and downstream communication using FEC algorithms.

FIG. 3 is a block diagram illustrating an example of an access node operable to provide upstream and downstream communication using a plurality of deployed and new FEC algorithms. In some implementations, the access node 150 can facilitate communication between the wide area network (e.g., wide area network 170 of FIG. 1) and CPE devices (e.g., CPE devices 120a-b and 130a-b of FIG. 1) through an access network (e.g., access network 140 of FIG. 1). The access node 150 can include one or more network interfaces 310 to communicate with the wide area network. In some implementations, the network interfaces 310 can be based on industry standard ethernet interfaces.

The access node can include one or more controllers 320 operable to provide packet processing and control for the network interfaces 310, MACs 330, downstream transmitters 340 and upstream receivers 350. The controllers 320 can process communication information received for network interfaces 310 and forward to MACs 330 for transmission on the access network (e.g., access network 140 of FIG. 1). Additionally, the controllers 320 can process communication information received from the MACs 330 for transmission on the wide area network (e.g. wide area network 170 of FIG. 1).

In some implementations, the MACs 330 can provide bandwidth allocation for one or more upstream communication paths (e.g. channels), process communication information for transmission on one or more downstream paths (e.g., frequency, time or code division channels, or combinations thereof), as well as provide quality of service (QoS) and maintenance capabilities. In some implementations, the associated processing and control of the access node (e.g., access node 150 of FIG. 1) can be distributed between the MACs 330 and the controllers 320. In some implementations, the MACs 330 can use one or more downstream communication paths (e.g. channels) to send communication information to a CPE device (e.g., CPE devices 120a-b or 130a-b of FIG. 1) to increase the downstream communication bandwidth available to a CPE device (e.g., channel bonding).

The MACs 330 can process the communication information for transmission though downstream transmitters 340. The downstream transmitters 340 can include a modulator, digital to analog convertor and analog signal conditioning circuitry. In some implementations, the downstream transmitters 340 can support a plurality of selectable deployed and new FEC algorithms for transmitting communication information received from MACs 330. For example, the deployed FEC algorithm can be Reed-Solomon-type algorithm, while the new FEC algorithm can be an LDPC-type algorithm. In other examples, other FEC algorithms can be used.

In some implementations, the downstream transmitter 330 can support a plurality of selectable single-carrier modulation formats (e.g., 1024-QAM, 4096-QAM, etc.). In other implementations, multi-carrier modulation formats can be used, including, for example, orthogonal frequency division multiplexing/orthogonal frequency division multiple access (OFDM/OFDMA), wavelet or sub-band division multiplexing (SDM), among others. In various implementations, the same or different FEC algorithms can be used on the downstream communication paths (e.g., channels).

In some implementations, an access node 150 can include one or more upstream receivers 350. The upstream receivers 350 can include a demodulator, analog to digital convertor and analog signal conditioning circuitry. In some implementations, the upstream receivers 350 can support a plurality of selectable deployed and new FEC algorithms for processing received communication information. For example, the deployed FEC algorithm can be a Reed-Solomon-type algorithm, while the new FEC algorithm can be an LDPC-type algorithm. In other examples, other FEC algorithms can be used.

In some implementations, the upstream receivers 350 can support a plurality of selectable single-carrier demodulation formats (e.g., 256-QAM, 1024-QAM,). In other implementations, multi-carrier demodulation formats can be used, include, for example, orthogonal frequency division multiplexing/orthogonal frequency division multiple access (OFDM/OFDMA), wavelet, sigma-delta modulation (SDM), among others.

The upstream receivers 350 can provide the MACs 330 with communication information from an upstream communication path (e.g., channel). In some implementations, the same or different FEC algorithm can be used on the upstream communication path. In other implementations, the upstream receivers 350 can be capable of providing communication information to the MACs 330 from multiple communication paths (e.g., channel bonding) wherein the same or different FEC algorithm can be used on the upstream communication paths (e.g., channels). In some implementations, elements of the upstream receivers 350 can be integrated into the MACs 330.

Figure 4A:
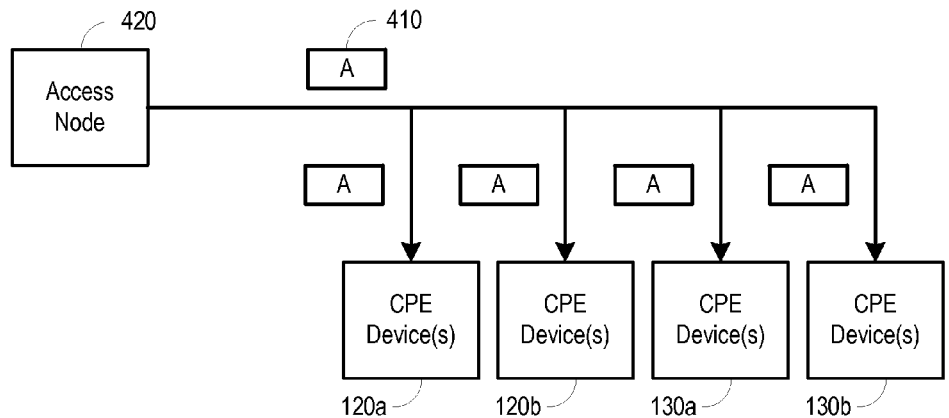
FIG. 4A and FIG. 4B are block diagrams illustrating communication systems operable to provide downstream communication paths with FEC algorithms.
Figure 4B:
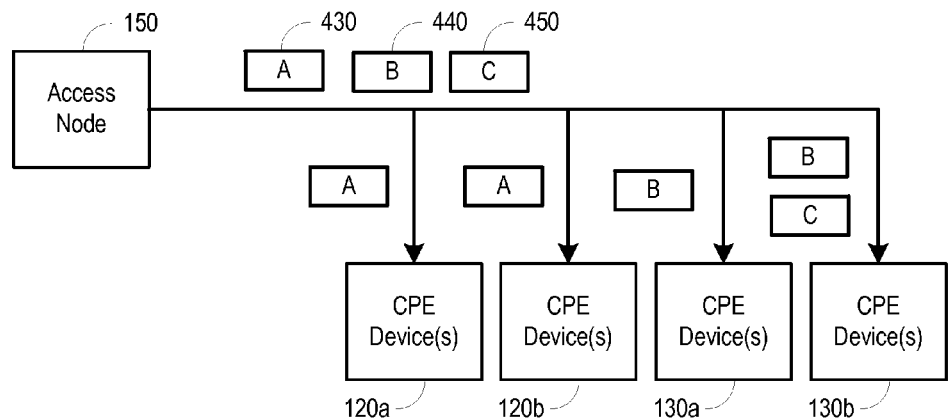

FIG. 4A and FIG. 4B are block diagrams illustrating a communication system operable to provide downstream communication paths with deployed and new FEC algorithms. The communication system can include access node 420 and CPE devices 120a-b that can implement a deployed FEC algorithm. The system can also include CPE devices 130a-b that can select from a plurality FEC algorithms, including both deployed FEC algorithms and new FEC algorithms. In some implementations, access node 420 can send communication information to CPE devices 120a-b and 130a-b using a deployed FEC algorithm. While CPE devices 130a-b can support new FEC algorithms that can increase downstream communication bandwidth, CPE devices 130a-b are backwards compatible with legacy access node 420 and can use deployed FEC algorithms and operate on the same downstream communication path 410 (e.g., channel) as CPE devices 120a-b.

FIG. 4B illustrates a plurality of downstream communication paths (e.g., channels) 430, 440 and 450. In some implementations, access node 140 can generate communication information using both deployed FEC algorithms and new FEC algorithms over one or more downstream communication paths 430, 440 and 450. A first downstream communications path (e.g., channel) 430 can support a deployed FEC algorithm associated with legacy CPE devices 120a-b. A second downstream communications path 440 can support a new FEC algorithm enabling increased downstream communications bandwidth associated with CPE devices 130a-b. A CPE device 130b can receive communication information from multiple downstream communications paths 440 and 450 (e.g., channel bonding). In some implementations, the FEC algorithm used for downstream communication paths 440 and 450 can be same. In other implementations, the FEC algorithm used for downstream communication paths 440 and 450 can be different. In some implementations, the downstream communication paths provided by access node 140 can be configured for a particular type of FEC algorithm and modulation format. In additional implementations, CPE devices 130a-b can initially use a deployed FEC algorithm to find a downstream communication path 430. The CPE devices 130a-b can use the downstream communication path 430 to enable the reception of a configuration file that can identify other downstream communication paths 440 and 450 where a new FEC algorithm and modulation format can be used for increased downstream communication bandwidth.

Figure 5:
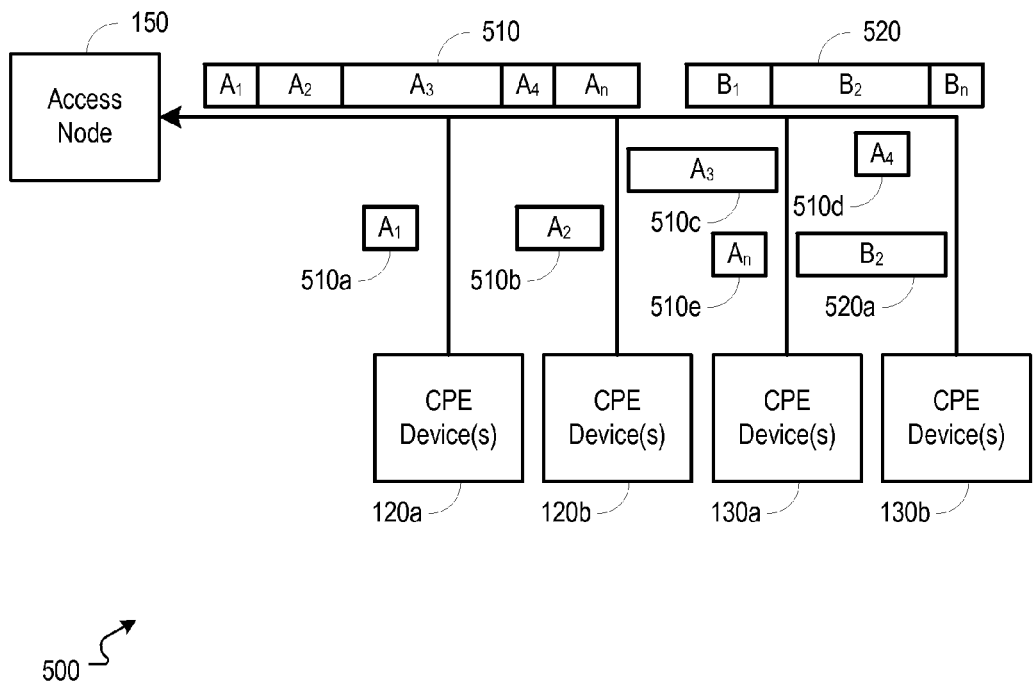
FIG. 5 is a block diagram illustrating a communication system operable to provide upstream communication paths using FEC algorithms.

FIG. 5 is a block diagram illustrating a communication system operable to provide upstream communication paths using a plurality of FEC algorithms. Access node 150 can receive communication information from CPE devices 120a-b, 130a-b on upstream communication paths 510 and 520. In some implementations, time division multiple (TDMA) access can be used for upstream communications where the upstream communications path shared between a plurality of CPE devices 120a-b and 130a-b can be subdivided in time. In other implementations, synchronous code division multiple access (SCDMA) can be used where the upstream communications path bandwidth can be subdivided by a spreader code. Channels $A_1$ 510a through $A_n$ 510a can represent upstream transmission opportunities using TDMA where contiguous time slots (e.g., burst) can be used to send communication information to access node 150 on communications path 510 for CPE devices 120a-b and 130a-b. A time slot can be a fixed or variable period of time wherein all time slots have the same time duration. In some implementations, the allocation of upstream transmission time slots to the CPE devices 120a-b and 130a-b can be dynamic and communicated by the access node 150 using a downstream communications path. In a DOCSIS based system a downstream MAP message can be used where an interval usage code (IUC) can identify an upstream burst profile. Upstream channel descriptor (UCD) messages sent to the CPE devices 120a-b, 130a-b can define the FEC algorithm, modulation format and other characteristics associated with an IUC. In some implementations, the access node 150 can determine the upstream transmission capabilities (e.g., FEC algorithms and the type of modulations) of the CPE devices 120a-b, 130a-b during CPE device sign-on (e.g., using configuration files during registration).

In some implementations, access node 150 can send a downstream message to CPE devices 120a-b allocating time slots $A_1$ 510a to $A_2$ 510b respectively on upstream communication path 510 using a deployed FEC algorithm and modulation format. Additionally, access node 150 can send a downstream message to CPE device 130a-b allocating time slots $A_3$ 510c and $A_n$ 510e (e.g., non-contiguous time slots) using a new FEC algorithm and modulation format. A CPE device 130a can send communication information to access node 150 in time slots $A_3$ 510c and $A_n$ 510e (e.g., noncontiguous time slots) using a new FEC algorithm and specified modulation format that can provide increased upstream communication bandwidth. In other implementations, the FEC algorithm and/or modulation format used by CPE device 130a for time slots $A_3$ 510c and $A_n$ 510e can be different.

Another CPE device 130b can send communication information to access node 150 on upstream communications paths 510 and 520 (e.g., using channel bonding) using time slots $A_4$ 510d and $B_2$ 520a. The FEC algorithm and/or modulation format used for time slots $A_4$ 510d and $B_2$ 520a can be the same or different.

Figure 6:
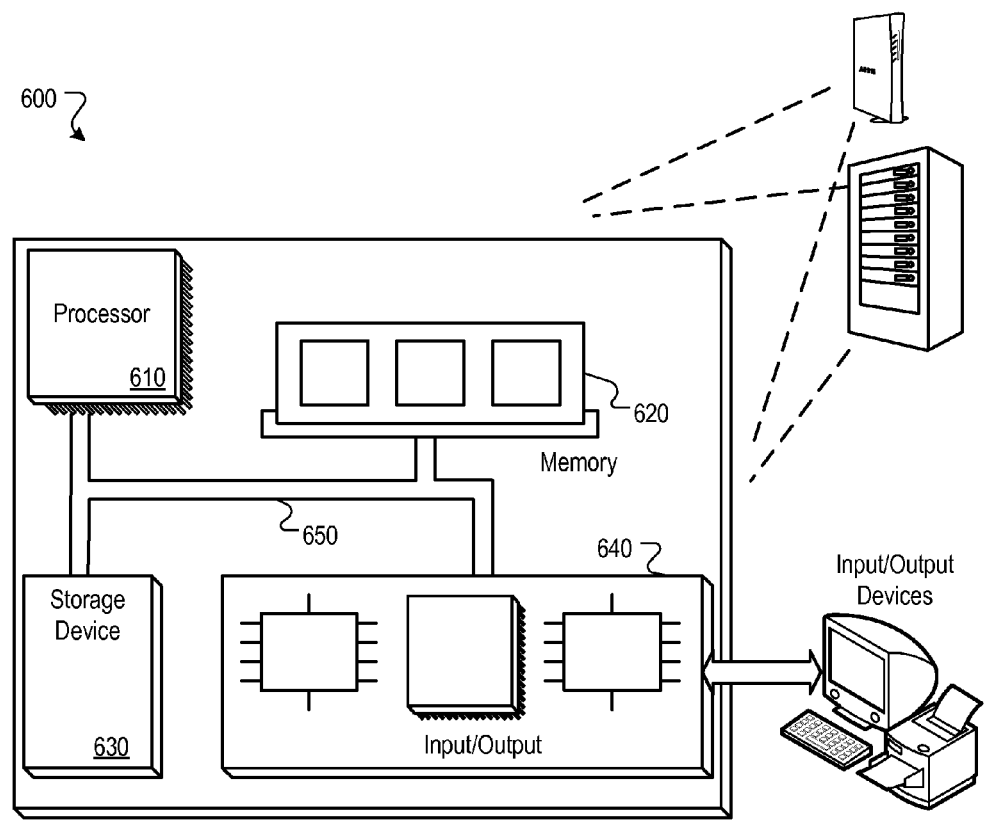
FIG. 6 is a block diagram illustrating an example access node and customer premise device operable to use FEC algorithms.

FIG. 6 is a block diagram illustrating a generic access node (e.g., access node 150 of FIG. 1) or CPE device (e.g., CPE devices 130a-b of FIG. 1) operable to use a plurality of FEC algorithms for downstream and upstream communications. The access node/CPE device 600 can include a processor 610, a memory 620, a storage device 630, and an input/output device 640. Each of the components 610, 620, 630, and 640 can, for example, be interconnected using a system bus 650. The processor 610 is capable of processing instructions for execution within the access node/CPE device 600. In one implementation, the processor 610 is a single-threaded processor. In another implementation, the processor 610 is a multi-threaded processor. The processor 610 is capable of processing instructions stored in the memory 620 or on the storage device 630. The processor 610 can be a complex of one or more processors.

The memory 620 stores information within the network attached processor based access node/CPE device 600. The memory 620 is a computer-readable medium. In various implementations, the memory 620 can include a volatile memory unit, a non-volatile memory unit, or combinations thereof.

In some implementations, the storage device 630 is capable of providing mass storage for the access node/CPE device 600. In some implementations, the storage device 630 is a computer-readable medium. In various different implementations, the storage device 630 can, for example, include a hard disk device, an optical disk device, flash memory or some other large capacity storage device.

The input/output device 640 provides input/output operations for the access node/CPE device 600. In some implementation, the input/output device 640 can include one or more interfaces for enabling communication through DOCSIS based, 802.16, FTTC, FTTP or satellite access networks. In another implementation, the input/output device can include driver devices configured to receive input data and send output data to other input/output devices, such as one or more computers as well as sending communications to, and receiving communications from a network (not shown). Other implementations, however, can also be used, such as mobile computing devices, mobile communication devices, set-top box television client devices, etc.

The communications device 600 (e.g., access node 150 of FIG. 1 or CPE devices 130a-b of FIG. 1) of this disclosure, and components thereof, can be realized by instructions that upon execution cause one or more processing devices to carry out the processes and functions described above. Such instructions can, for example, comprise interpreted instructions, such as script instructions, e.g., JavaScript or ECMAScript instructions, or executable code, or other instructions stored in a computer readable medium.

Implementations of the subject matter and the functional operations described in this specification can be provided in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine generated electrical, optical, or electromagnetic signal that is generated to encode information for transmission to suitable receiver apparatus for execution by a computer. The computer readable medium can be a machine readable storage device, a machine readable storage substrate, a memory device, a composition of matter effecting a machine readable propagated signal, or a combination of one or more of them.

The term "system processor" encompasses all apparatus, devices, and machines for processing data, including by way of example a programmable processor, a computer, or multiple processors or computers. The system processor can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output thereby tying the process to a particular machine (e.g., a machine programmed to perform the processes described herein). The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The elements of a computer typically include a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile communications device, a telephone, a cable modem, a set-top box, a mobile audio or video player, or a game console, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD ROM disks. The processor and the memory can be supplemented by, or incorporated in, special purpose logic circuitry.

To provide for interaction with a user, embodiments of the subject matter described in this specification can be operable to interface with a computing device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

What is claimed is:

1. A system, comprising:
   an access node operable to send communication information on a plurality of downstream paths over an access network;
   a plurality of CPE devices of a first and second type operable to receive the communication information on at least one of the plurality of downstream communication paths over the access network;
   wherein the downstream communication paths are individually configured to send communication information to the CPE devices using one of a deployed forward error correction algorithm and new forward error correction algorithm;
   the CPE devices of the first type being operable to receive the communication information using the deployed forward error correction algorithm; and
   the CPE devices of the second type operable to receive communication information using either of the deployed forward error correction algorithm and new forward error correction algorithm.

2. The system of claim 1, wherein one or more of the downstream communication paths use one of 1024-QAM, 4096-QAM, OFDM, OFDMA, wavelet and SDM to modulate the communication information.

3. The system of claim 1, wherein the new forward error correction algorithm is a low density parity check-type algorithm.

4. The system of claim 1, wherein the access network is one of DOCSIS, FTTC, FFTP, 802.16 and satellite.

5. The system of claim 1, wherein the plurality of downstream communication paths are used to send communication information to one or more individual CPE devices.

6. The system of claim 5, wherein different forward error correction algorithms are used on the downstream communication paths based on the configuration of the downstream communication path.

7. The system of claim 1, wherein the access node is configured to specify the forward error correction algorithm and modulation format used over one or more downstream communication paths.

8. The system of claim 1, wherein the access node comprises one of a CMTS, EQAM or DSLAM.

9. The system of claim 1, wherein the CPE devices comprises one of cable modem, EMTA, set top box, media gateway, and modem.

10. A system, comprising:
    an access node operable to receive communication information from a access network on one or more upstream communication paths and to send communication information on a plurality of downstream paths on the access network;
    wherein a customer premise equipment device is operable to send communication information to the access node on one or more upstream communication paths using one or more forward error correction algorithms and modulation formats;
    wherein the upstream communication paths individually comprise a plurality of time slots to send communication information;
    a plurality of downstream messages to allocate a plurality of non-contiguous time slots and specify the forward error correction algorithm and modulation format for the customer premise equipment device to use in sending the communication information on the upstream communication paths, the upstream communications paths being thereby individually configured to send communication information upstream using either a deployed forward error correction algorithm or new forward error correction algorithm as the one or more forward error correction algorithms used; and
    wherein, the customer premise equipment device uses the plurality of non-contiguous time slots and a low density parity check-type algorithm is one of the one or more forward error correction algorithms used.

11. The system of claim 10, wherein QPSK, QAM, and SCDMA are two of the one or more modulation formats.

12. The system of claim 10, wherein the modulation format is one of OFDM, OFDMA, wavelet and SDM.

13. The system of claim 10, wherein the access network is one of DOCSIS, FTTC, FFTP, 802.16 and satellite.

14. The system of claim 10, wherein the access node comprises one of a CMTS and EQAM.

15. The system of claim 10, wherein the CPE devices comprises one of cable modem, EMTA, set top box, media gateway and modem.

16. A computer-implemented method, comprising:
   receiving one or more downstream communication messages at a customer premise equipment device;
   wherein the downstream communication messages allocate a plurality of time slots on an upstream communication path to a CPE device specifying the use of one of a plurality of forward error correction algorithms and modulation formats;
   transmitting communication information in the allocated time slots on the upstream communication path with the specified forward error correction algorithm and modulation format; and
   wherein one of the plurality of forward error correction algorithms is a low-density parity check-type algorithm.

17. The method of claim 16, wherein the plurality of time slots are non-contiguous and different forward error correction algorithms are used.

18. The method of claim 16, wherein the plurality of time slots are non-contiguous and different modulation formats are used.

19. The method of claim 18, wherein the two or more of the modulation formats are QPSK, QAM and SCDMA.

* * * * *